United States Patent
Willmeroth et al.

(10) Patent No.: US 8,569,150 B2
(45) Date of Patent: Oct. 29, 2013

(54) METHOD FOR PRODUCING A SEMICONDUCTOR DEVICE WITH A SEMICONDUCTOR BODY

(75) Inventors: Armin Willmeroth, Augsburg (DE); Franz Hirler, Isen (DE)

(73) Assignee: Infineon Technologies Austria AG, Villach (AT)

(*) Notice: Subject to any disclaimer, the term of this patent is extended or adjusted under 35 U.S.C. 154(b) by 38 days.

(21) Appl. No.: 13/085,196

(22) Filed: Apr. 12, 2011

(65) Prior Publication Data
US 2011/0189839 A1    Aug. 4, 2011

Related U.S. Application Data

(62) Division of application No. 12/052,019, filed on Mar. 20, 2008, now abandoned.

(51) Int. Cl.
*H01L 21/20* (2006.01)
*H01L 21/38* (2006.01)

(52) U.S. Cl.
USPC ............. 438/478; 257/487; 257/E21.106; 438/268; 438/269; 438/491; 438/514

(58) Field of Classification Search
USPC ......... 438/173–175, 478, 510, 514–522, 527, 438/529
See application file for complete search history.

(56) References Cited

U.S. PATENT DOCUMENTS

| 6,551,909 | B1* | 4/2003 | Fujihira | 438/510 |
| 6,667,514 | B2* | 12/2003 | Ahlers et al. | 257/336 |
| 6,878,989 | B2 | 4/2005 | Izumisawa et al. | |
| 2003/0122222 | A1 | 7/2003 | Okumura et al. | |
| 2008/0164480 | A1* | 7/2008 | Kang et al. | 257/76 |

FOREIGN PATENT DOCUMENTS

WO    2007048387 A2    5/2007

* cited by examiner

*Primary Examiner* — Ha Tran T Nguyen
*Assistant Examiner* — Raj R Gupta
(74) *Attorney, Agent, or Firm* — Dicke, Billig & Czaja, PLLC

(57) ABSTRACT

A semiconductor device with a semiconductor body and method for its production is disclosed. The semiconductor body includes drift zones of epitaxially grown semiconductor material of a first conduction type. The semiconductor body further includes charge compensation zones of a second conduction type complementing the first conduction type, which are arranged laterally adjacent to the drift zones. The charge compensation zones are provided with a laterally limited charge compensation zone doping, which is introduced into the epitaxially grown semiconductor material. The epitaxially grown semiconductor material includes 20 to 80 atomic % of the doping material of the drift zones and a doping material balance of 80 to 20 atomic % introduced by ion implantation and diffusion.

10 Claims, 9 Drawing Sheets

METHOD FOR PRODUCING A SEMICONDUCTOR DEVICE WITH A SEMICONDUCTOR BODY

CROSS-REFERENCE TO RELATED APPLICATIONS

This application is a Divisional Application of U.S. patent application Ser. No. 12/052,019, entitled SEMICONDUCTOR DEVICE WITH A SEMICONDUCTOR BODY AND METHOD FOR ITS PRODUCTION having a filing date of Mar. 20, 2008, and which is incorporated herein by reference

BACKGROUND

The application relates to a semiconductor device with a semiconductor body and to a method for its production. The semiconductor body includes drift zones of epitaxially grown semiconductor material of a first conduction type. The semiconductor body further includes charge compensation zones of a second conduction type complementing the first conduction type, which are arranged laterally adjacent to the drift zones. The charge compensation zones are provided with a laterally limited charge compensation zone doping, which is introduced into the epitaxially grown semiconductor material.

A minimum on resistance is desirable in charge compensation devices of this type. In order to achieve a further reduction of this on resistance, the level of drift zone doping material has to be increased further. Owing to the compensation principle, however, the doping of the charge compensation zones has to be increased in the same way. In order to ensure a complete depletion of charge carriers from the drift zones in the off phase of the semiconductor device in spite of such an increase in the level of doping material both in the drift zones and in the charge compensation zones, the geometrical period in the form of the step size of the charge compensation zones and possibly even of the drift zones has to be reduced further at the same time. In other words, the concentration of doping material per unit of area as integrated in the horizontal direction must not be higher than twice the breakdown charge. The term breakdown charge denotes the charge carrier quantity (doping material concentration quantity) per unit of area which, starting from a p-n junction, is depleted if the breakdown field strength is applied. As the compensation regions are depleted from both sides, the requirement that the regions should be capable of being depleted is equivalent to the requirement that the concentration of doping material per unit of area as integrated in the horizontal direction should not be higher than twice the breakdown charge. These conditions have to be met both by the compensation regions and by the drift zones. Similar to the breakdown field strength, the breakdown charge is determined by the concentration of doping material; for silicon is lies between $1 \times 10^{12}$ cm$^{-2}$ at low doping and $3 \times 10^{12}$ cm$^{-2}$ at high doping.

By using trench technology, wherein the charge compensation zones and/or the drift zones are arranged in trench structures, very small step sizes can be obtained in theory, but this technology has not yet penetrated the market, so that the concept of multiple epitaxy is used to build semiconductor devices of this type. In multiple epitaxy, epitaxial growth phases are interspersed with unmasked large-area and masked selective implantation processes for doping materials. To reduce costs, the number of epitaxial growth phases is limited.

The regions of a complementary conduction type for the charge compensation zones, which are introduced by masked or selective ion implantation and typically doped with boron, have to diffuse together through the epitaxial growth phases of finite thickness. This however unavoidably involves major widening of the columns or strips of charge compensation zone material. To reduce this widening problem caused by lateral diffusion, non-doped epitaxial layers can be grown in the epitaxial growth phase, whereupon both doping materials of the first conduction type and doping materials of the complementary second conduction type can be introduced in succession by ion implantation near the surface between individual epitaxial growth phases, so that the widening caused by lateral outdiffusion while the charge compensation zones diffuse together can be noticeably reduced by a relatively high adjacent n-doping of the drift zones.

However, initially high-impedance non-doped epitaxial layers are generated in the epitaxial growth phase, so that the on resistance of the drift zones cannot be reduced as desired. The n-doping in the middle of the epitaxial growth phase is relatively low can only be compensated by raising the general level of implanted doping material in order to reduce the on resistance. A high level of doping material, however, automatically complicates the manufacturing process, as breakdown voltage is highly dependent on wrong doping. The higher the level of doping material, the higher are its fluctuations and the more difficult is it to obtain the required breakdown voltage.

For these and other reasons, there is a need for the present invention.

SUMMARY

An embodiment of the invention relates to a semiconductor device with a semiconductor body. The semiconductor body includes drift zones of epitaxially grown semiconductor material of a first conduction type. The semiconductor body further includes charge compensation zones of a second conduction type complementing the first conduction type, which are arranged laterally adjacent to the drift zones. The charge compensation zones are provided with a laterally limited charge compensation zone doping, which is introduced into the epitaxially grown semiconductor material. The epitaxially grown semiconductor material contains 20 to 80 atomic % of the doping material of the drift zones and a doping material balance between 80 and 20 atomic % introduced by ion implantation and diffusion.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 1-8 illustrate production processes for a semiconductor device of an embodiment of the invention.

FIGS. 10-18 illustrate production processes for a semiconductor device of a further embodiment of the invention.

DETAILED DESCRIPTION

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope. The following detailed description, therefore, is not to be taken in a limiting sense, and the scope is defined by the appended claims.

Figure 1:
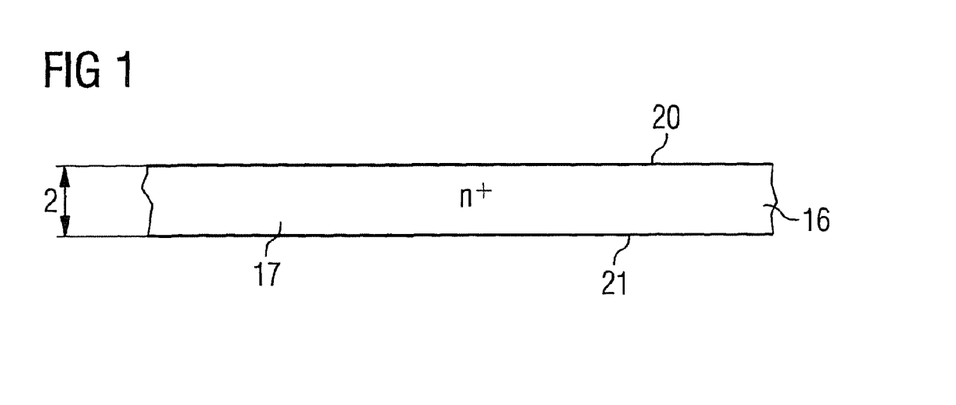
FIG. 1 illustrates a diagrammatic cross-section through a semiconductor wafer.

FIG. 1 illustrates a diagrammatic cross-section through a semiconductor wafer 16, which can be used as a semiconductor substrate 17 for a variety of semiconductor devices. This semiconductor wafer 16 may, for example, initially be highly doped with a doping material for a first conduction type, thus being $n^+$-conducting, to produce MOSFET power transistors with a compensation structure. As doping materials, arsenic or phosphorus may be introduced during the single crystal growing phase in concentrations between $5 \times 10^{18}$ cm$^{-3}$ and $5 \times 10^{20}$ cm$^{-3}$ or generated in the crystal by appropriate neutron bombardment. A first epitaxial layer is deposited on the front side 20, which has been polished mirror-bright in a chemical-mechanical process, in a first epitaxial growth phase.

Figure 2:
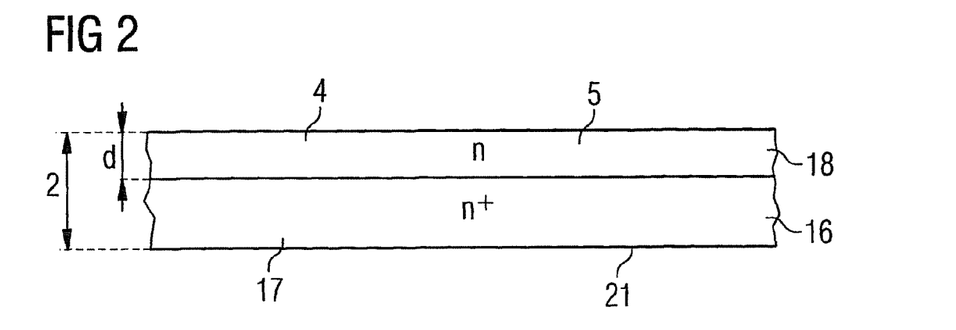
FIG. 2 illustrates a diagrammatic cross-section through the semiconductor wafer according to FIG. 1 following the completion of a first epitaxial growth phase with homogeneous doping of the epitaxial layer.

FIG. 2 illustrates a diagrammatic cross-section through the semiconductor wafer 16 according to FIG. 1 following the completion of a first epitaxial growth phase. In this epitaxial growth phase, a thickness d of n-type silicon is grown in a monocrystalline manner; in this first embodiment of the invention, 20 to 80 atomic % of the doping material for drift zones are homogeneously distributed in this epitaxial layer. The missing doping material quantity of 80 to 20 atomic % can be introduced near the surface by ion implantation to limit the widening of the compensation regions by the lateral diffusion of the complementary-type doping materials for charge compensation zones.

This homogeneous pre-doping, which however only provides 20 to 80 atomic % of the doping materials of the drift zones, avoids the disadvantage of the relatively high resistance in the middle region of the epitaxial growth phase, which occurs in multiple epitaxial processes with non-doped epitaxial growth phases. In multiple epitaxial processes, a non-doped epitaxial layer is often applied, followed by the doping of the drift zones and the charge compensation zones by ion implantation. The pre-doping described above avoids such disadvantages of reduced conductivity in the middle of the epitaxial growth phase.

Figure 3:
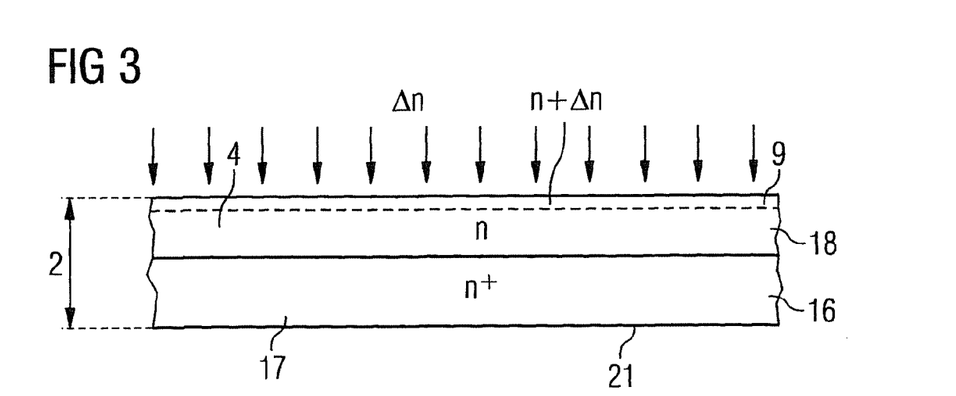
FIG. 3 illustrates a diagrammatic cross-section through the semiconductor wafer according to FIG. 2 following the large-area unmasked ion implantation of a doping material balance for a first conduction type.

The missing doping material balance between 80 and 20 atomic % can then be introduced near the surface by ion implantation as illustrated in FIG. 3, thereby limiting the lateral widening of the charge compensation columns. The on resistance is affected both by wide compensation regions and by insufficiently high doping in the middle of the epitaxial growth phases. By using simulations, it can be shown that the on resistance can be minimized by the combination of two methods described above, i.e. the doping of the epitaxy and implantation between the epitaxial growth phases.

FIG. 3 illustrates a diagrammatic cross-section through the semiconductor wafer 16 according to FIG. 2 following the ion implantation of a doping material balance Δn for a first conduction type. As FIG. 3 illustrates, a charge carrier concentration of n+Δn is obtained near the surface of the first epitaxial layer 18 by an additional ion implantation of, for example, phosphorus or arsenic for a first conduction type 4 of the drift zones. The near-surface zone with the doping material balance 9 of 80 to 20 atomic % of drift zone doping as illustrated in FIG. 3 will in the subsequent diffusion process be distributed in the illustrated epitaxial layer to a thickness d.

Figure 4:
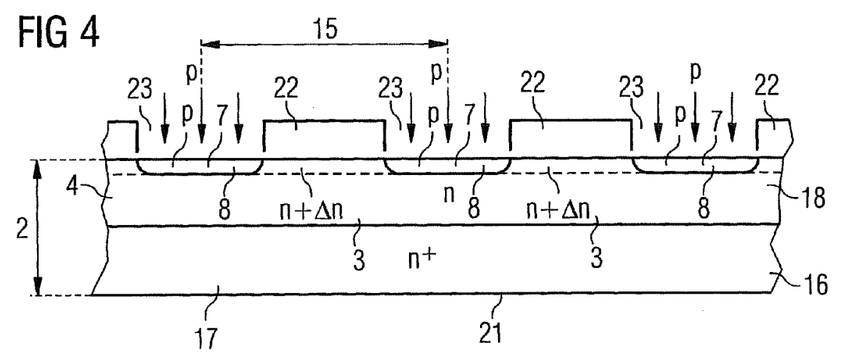
FIG. 4 illustrates a diagrammatic cross-section through the semiconductor wafer according to FIG. 3 following the masked selective ion implantation of a complementary second conduction type.

FIG. 4 illustrates a diagrammatic cross-section through the semiconductor wafer according to FIG. 3 following the selective ion implantation of a complementary conduction type 7 in windows 23 of a previously applied ion implantation mask 22 for the second complementary conduction type 7. Boron may be used as a doping material for the complementary conduction type 7. As a concentration of doping material increased by Δn prevails near the surface in the drift zone regions 3, the lateral expansion of the charge compensation zone doping 8 in the subsequent diffusion process to form charge compensation zone columns or strips is limited, allowing for a smaller step size between the charge compensation zones and thus permitting a higher doping of the drift zones.

Figure 5:
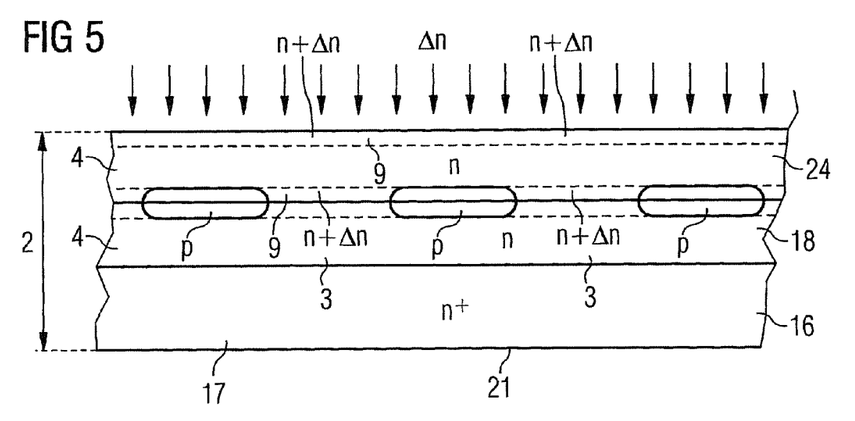
FIG. 5 illustrates a diagrammatic cross-section through the semiconductor wafer according to FIG. 4 following a second epitaxial growth phase and a large-area unmasked ion implantation of a doping material balance of the first conduction type.

FIG. 5 illustrates a diagrammatic cross-section through the semiconductor wafer 16 according to FIG. 4 following a second epitaxial growth phase and an ion implantation of a doping material balance of the first conduction type, which is once again introduced into this second epitaxial layer 24 unmasked, over a large area and near the surface. This ion implantation of the first conduction type 4 for the drift zone 3 does not require any diffusion mask for the near-surface introduction of the doping material balance 9. Only the next process illustrated in FIG. 6 requires a suitable ion implantation mask 22 for the selective introduction of a doping material of a complementary conduction type.

Figure 6:
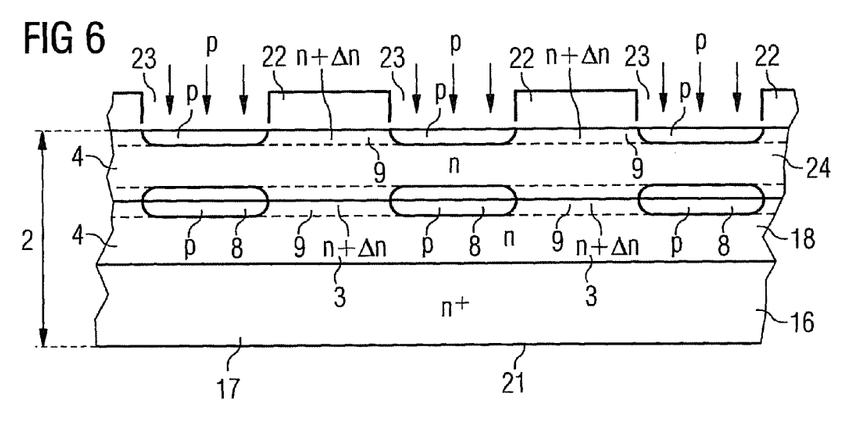
FIG. 6 illustrates a diagrammatic cross-section through the semiconductor wafer according to FIG. 5 following the masked selective ion implantation of a doping material of a complementary second conduction type.

FIG. 6 illustrates a diagrammatic cross-section through the semiconductor wafer 16 according to FIG. 5 following the selective ion implantation of a doping material of a complementary second conduction type. This creates a further doping material reservoir in the open windows 23 of the ion implantation mask 22, but without any connection to the complementary-type regions of the charge compensation zones as illustrated in FIG. 4.

Figure 7:
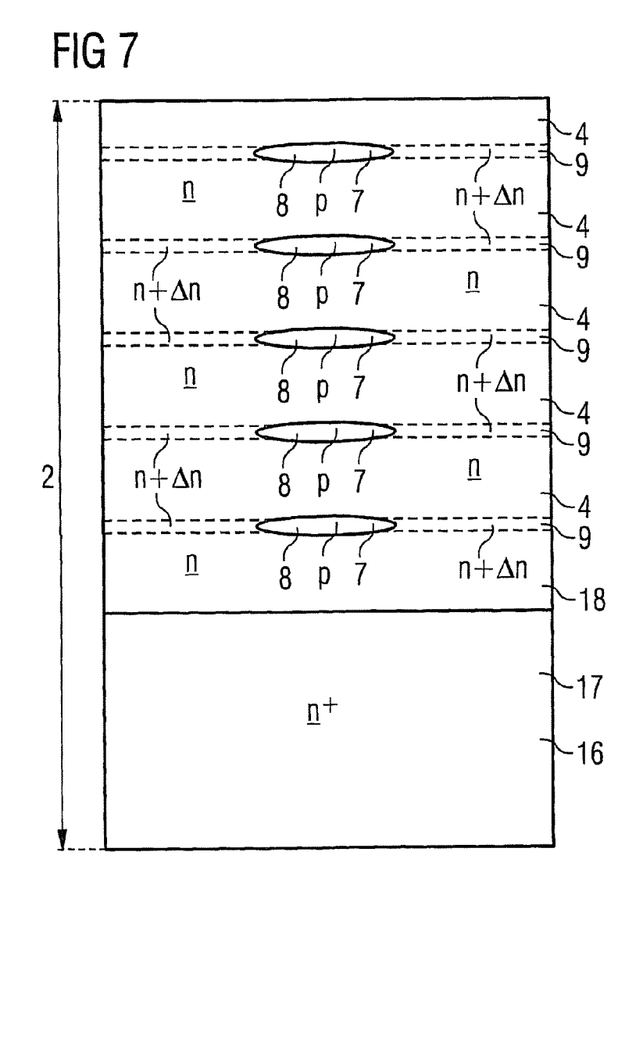
FIG. 7 illustrates a diagrammatic cross-section through a section of the semiconductor wafer following the completion of six epitaxial growth phases.

FIG. 7 illustrates a diagrammatic cross-section through a section of the semiconductor wafer following the completion of six epitaxial growth phases, wherein 20 to 80 atomic % of homogeneously distributed doping material of the first conduction type 4 have been introduced and the missing doping material balance is introduced near the surface in the regions 9 by ion implantation after each epitaxial growth phase, resulting in the structure illustrated in FIG. 7, wherein the selectively introduced charge compensation zone doping 8 does not yet form a coherent charge compensation zone column or strip. This requires a further diffusion process, wherein the doping material balance 9 for the drift zones 3 is distributed further in the semiconductor material.

Figure 8:
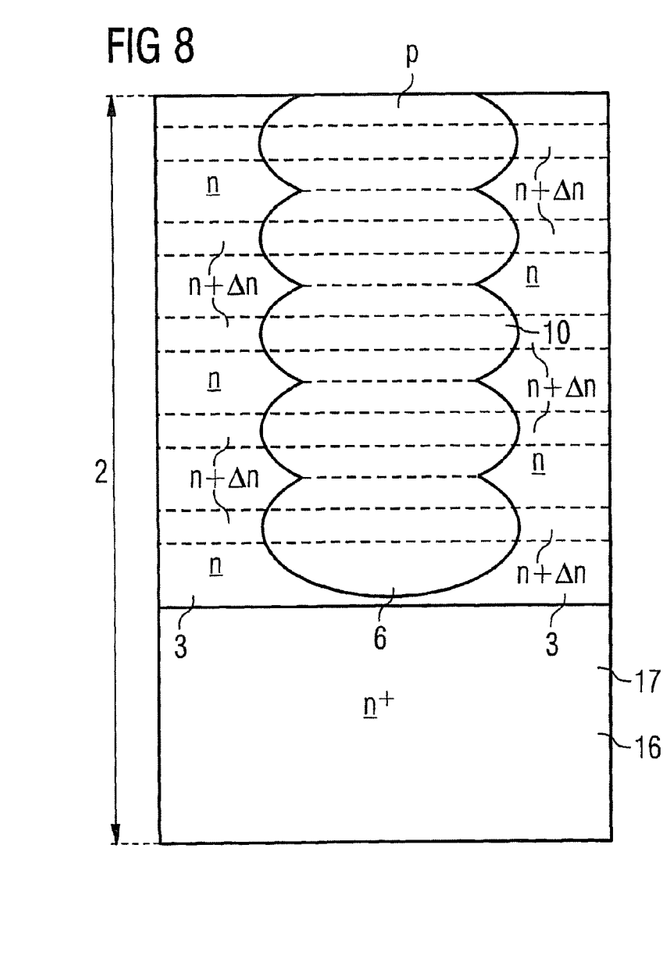
FIG. 8 illustrates a diagrammatic cross-section through the section according to FIG. 7 following the diffusing together of the implanted charge compensation zone doping to form a column- or strip-shaped charge compensation zone.

FIG. 8 illustrates a diagrammatic cross-section through the section according to FIG. 7 following the diffusing together of the implanted charge compensation zone doping to form a column- or strip-shaped charge compensation zone 6. Whether column- or strip-shaped charge compensation zones 6 are generated depends on the ion implantation mask prepared for the semiconductor device. The doping material balance Δn has likewise been distributed further in the drift zones 3 by diffusion processes, so that relatively highly doped drift zones 3 of a small step size p in micrometers of $p \leq 12$ μm can be created, which reduces the on resistance of a semiconductor device with a drift zone structure of this type.

Figure 9:
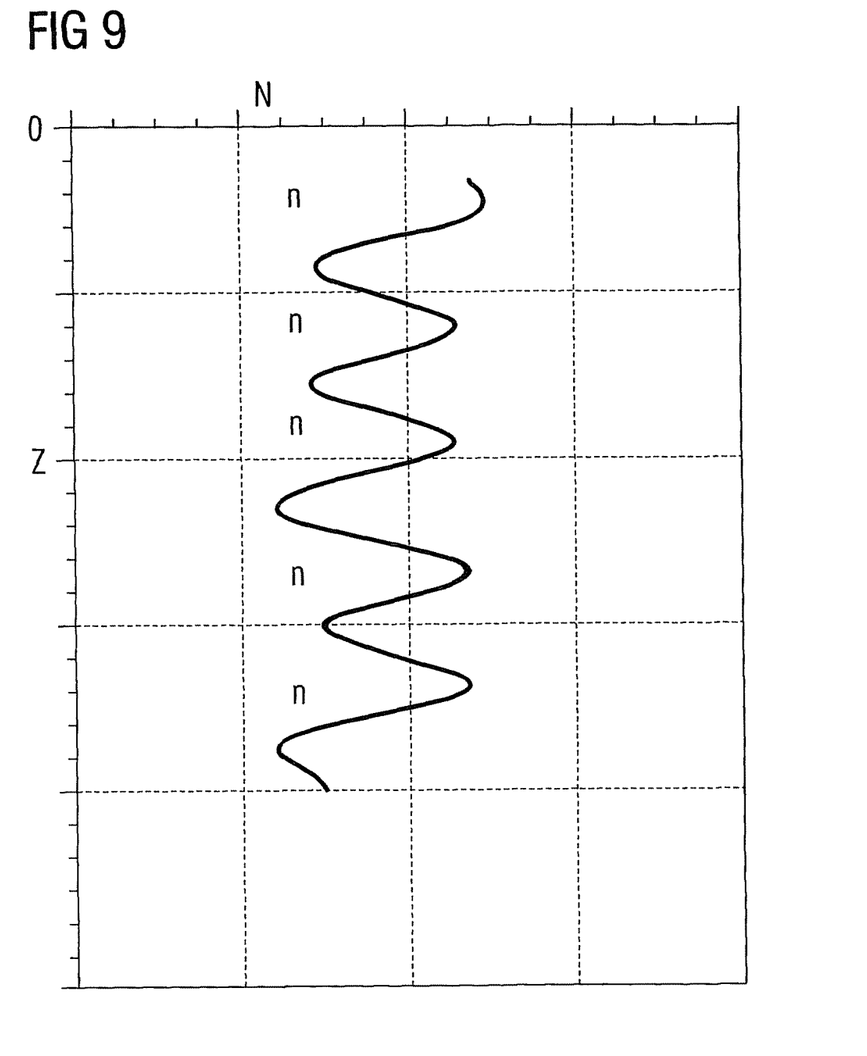
FIG. 9 illustrates a diagram of the concentration behaviour of the doping material of the first conduction type in a drift zone.

FIG. 9 illustrates a diagram with optimised concentration fluctuations of the doping material in a drift zone. The doping material concentration N is plotted on the abscissa, while the penetration depth, which is a measure for the blocking capability of the semiconductor device, is plotted on the ordinate. Compared to semiconductor devices with a non-doped epitaxy, where the maximum and minimum values fluctuate about twice as much, concentration fluctuations are noticeably minimized owing to the homogeneous pre-doping of the epitaxial layers in the range of 20 to 80 atomic %.

The homogeneously distributed proportion of doping material in the epitaxial growth phases can be limited to a third of the total concentration of doping material for the first conduction type, while two thirds subsequently have to be introduced near the surface by ion implantation. In this embodiment of the invention, it is on the other hand desirable that the proportion of doping material introduced by ion implantation is significantly larger than the proportion introduced into the semiconductor crystal by homogeneous doping in the epitaxial growth phase.

Fluctuations in the concentration of doping material for the drift zones can be reduced further by using a technology and a manufacturing process described below with reference to FIGS. 10 to 18 and resulting in a semiconductor device illustrated in FIG. 19. This method is likewise based on a semiconductor wafer 16 as illustrated in FIG. 10, which is highly doped with an $n^+$-type doping material.

Figure 10:
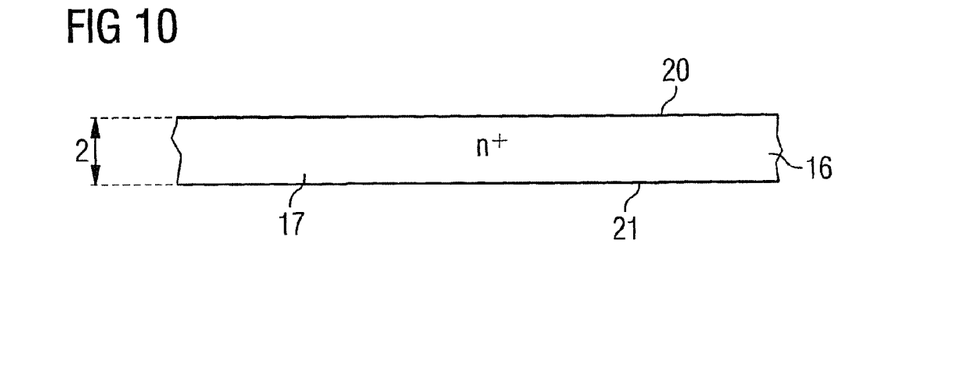
FIG. 10 illustrates a diagrammatic cross-section through a semiconductor wafer.
Figure 11:
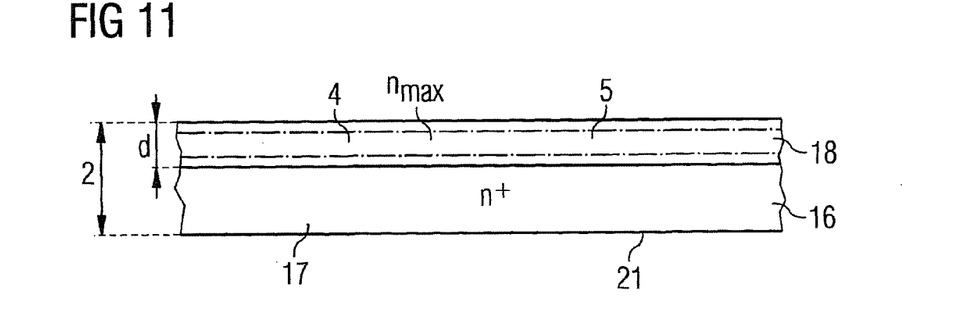
FIG. 11 illustrates a diagrammatic cross-section through the semiconductor wafer according to FIG. 10 following the completion of a first epitaxial growth phase with inhomogeneous doping of the epitaxial layer.

FIG. 11 illustrates a diagrammatic cross-section through the semiconductor wafer 16 according to FIG. 10 following the completion of a first epitaxial growth phase. In this epitaxial growth phase, however, the doping material is not introduced homogeneously, but rather inhomogeneously, i.e. the addition of doping material is reduced or stopped completely during the epitaxial growth process, resulting in a maximum of doping material approximately in the middle of the epitaxial growth phase. The boundaries of the region with a maximum doping $n_{max}$ are indicated by dot-dash lines in the epitaxial layer 18 of FIG. 11.

Figure 12:
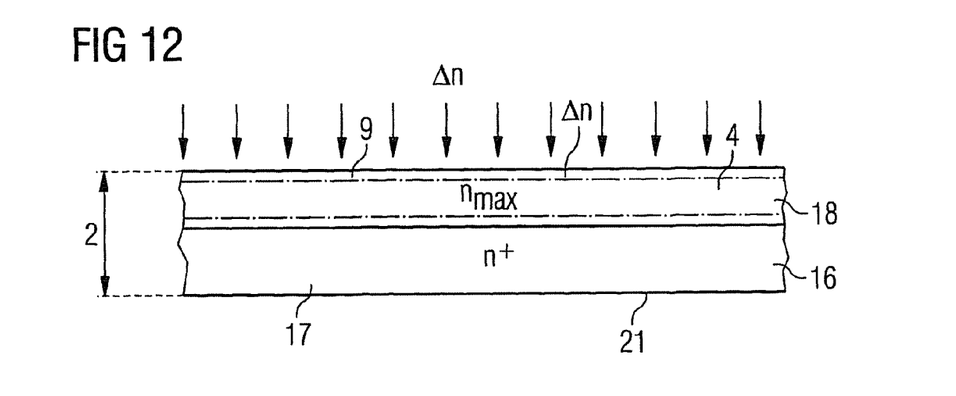
FIG. 12 illustrates a diagrammatic cross-section through the semiconductor wafer according to FIG. 11 following the large-area unmasked ion implantation of a doping material balance for a first conduction type.

In the subsequent ion implantation to introduce a doping material balance Δn, the relatively lightly doped, near-surface region is filled unmasked with the doping material balance over a large area by using ion implantation as illustrated in FIG. 12.

Figure 13:
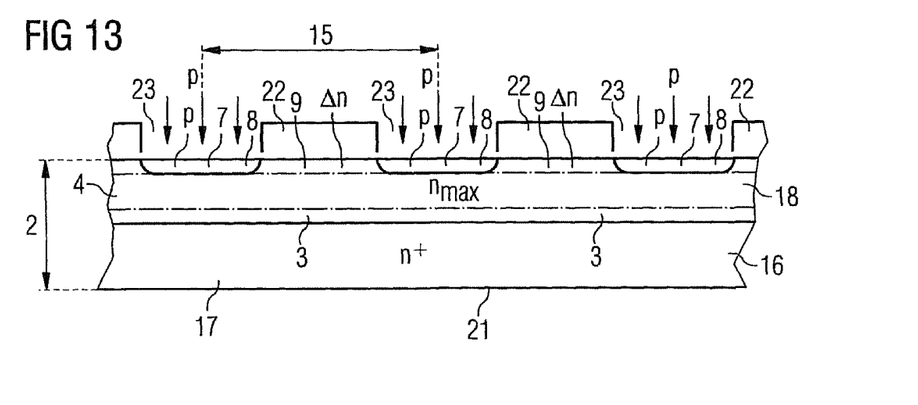
FIG. 13 illustrates a diagrammatic cross-section through the semiconductor wafer according to FIG. 12 following the masked selective ion implantation of a doping material for a complementary second conduction type.

FIG. 13 illustrates a diagrammatic cross-section through the semiconductor wafer according to FIG. 12 following the selective ion implantation of a doping material for a complementary second conduction type. This FIG. 13 corresponds to FIG. 4, and owing to the ion-implanted concentration of doping material, the lateral outdiffusion of the p-type material introduced by ion implantation is limited, allowing the production of compensated semiconductor devices with small step sizes of less than 12 μm.

Figure 14:
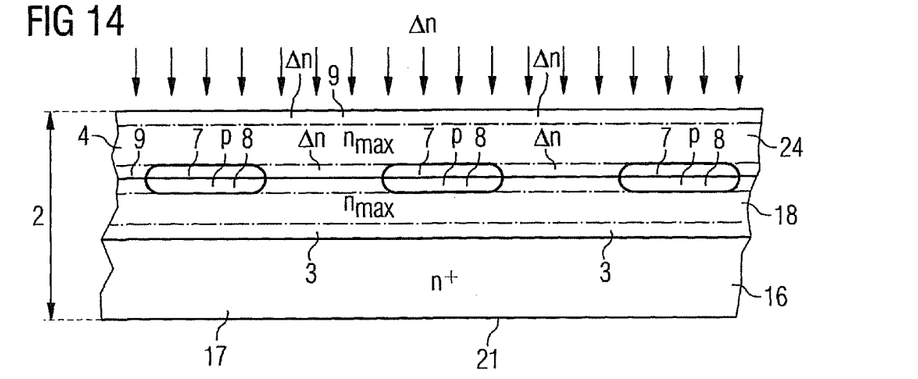
FIG. 14 illustrates a diagrammatic cross-section through the semiconductor wafer according to FIG. 13 following a second epitaxial growth phase and a large-area unmasked ion implantation of a doping material balance of a first conduction type.

FIG. 14 illustrates a diagrammatic cross-section through the semiconductor wafer according to FIG. 13 following a second epitaxial growth phase and an ion implantation of a doping material balance of a first conduction type, which is once again introduced unmasked and over a large area into the semiconductor wafer. Moreover, a maximum $n_{max}$ of doping material is introduced in the middle of the growth phase during the second epitaxial growth phase, in order to increase the doping in the drift zone further and to ensure that the on resistance for a compensated device of this type is further reduced. FIG. 14 also indicates by a dot-dash line that the doping of the epitaxial layer is initially reduced towards the surface, but the missing doping material balance is then introduced by large-area ion implantation, resulting in a concentration which is capable of impeding a lateral outdiffusion for the charge compensation zones to be formed.

Figure 15:
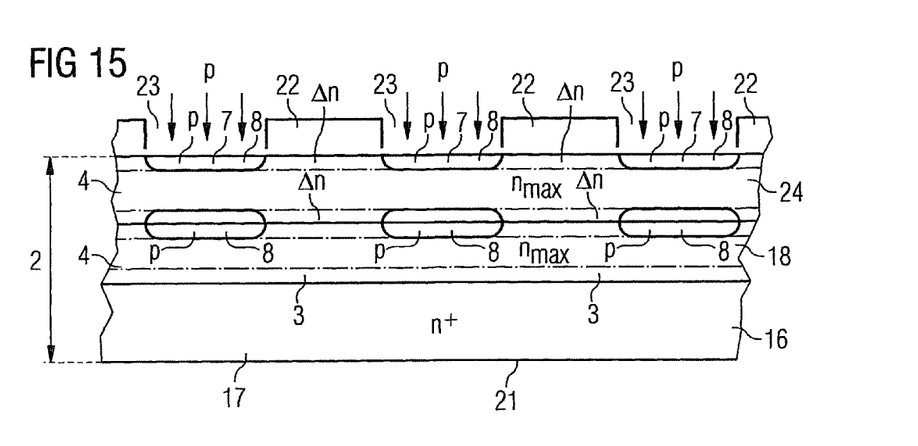
FIG. 15 illustrates a diagrammatic cross-section through the semiconductor wafer according to FIG. 14 following the masked selective ion implantation of a doping material of a complementary second conduction type.

FIG. 15 illustrates a diagrammatic cross-section through the semiconductor wafer 16 according to FIG. 14 following the selective ion implantation of a doping material of a complementary second conduction type in windows 23 of an ion implantation mask 22, generating further p-type islands which are diffused together on completion of all of the epitaxial growth phases; in this process, the concentration of doping material in the drift zones becomes uniform.

Figure 16:
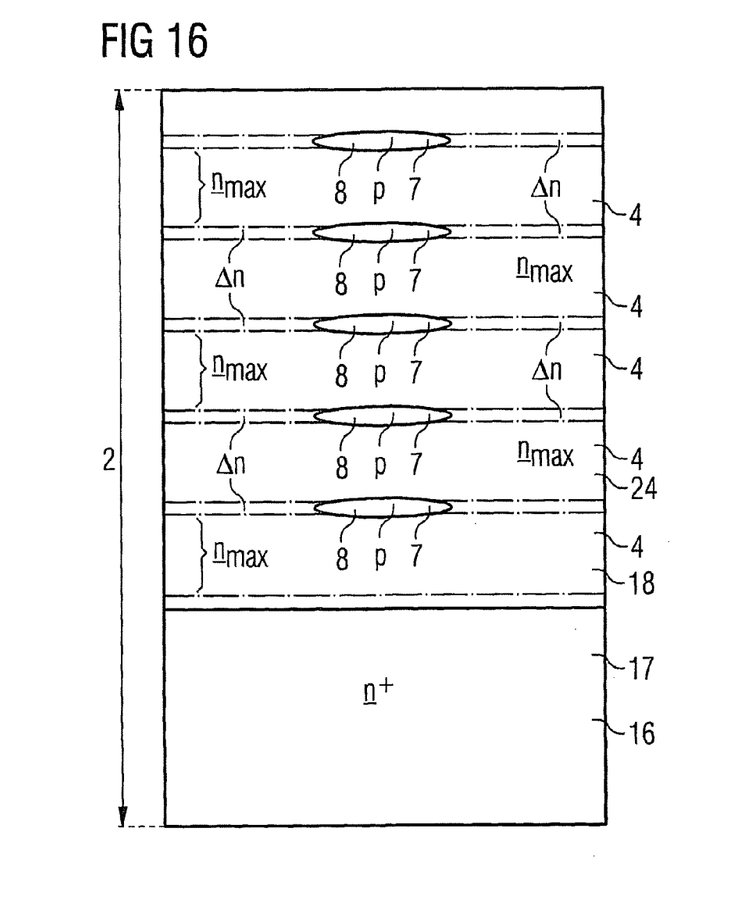
FIG. 16 illustrates a diagrammatic cross-section through a section of the semiconductor wafer following the completion of six epitaxial growth phases.

FIG. 16 illustrates a diagrammatic cross-section through a section of the semiconductor wafer following the completion of six epitaxial growth phases, wherein initially a maximum doping $n_{max}$ of the first conduction type 4 is generated in each epitaxial growth phase, followed by the introduction of a doping material balance in the region of the future drift zones by large-area ion implantation.

Figure 17:
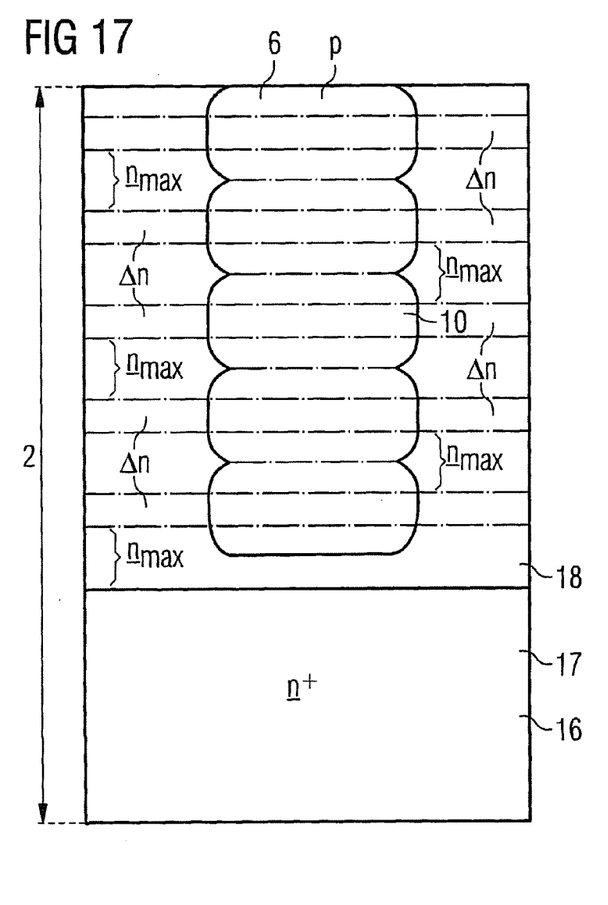
FIG. 17 illustrates a diagrammatic cross-section through the section according to FIG. 16 following the diffusing together of the implanted charge compensation zone doping to form a column- or strip-shaped charge compensation zone.

FIG. 17 illustrates a diagrammatic cross-section through the section according to FIG. 16 following the diffusing together of the implanted charge compensation zone doping 8 to form a column- or strip-shaped charge compensation zone 6. This column 10 illustrates a reduced lateral outdiffusion between individual epitaxial growth phases, allowing for a smaller step size in combination with higher doping of the drift zones 3.

Figure 18:
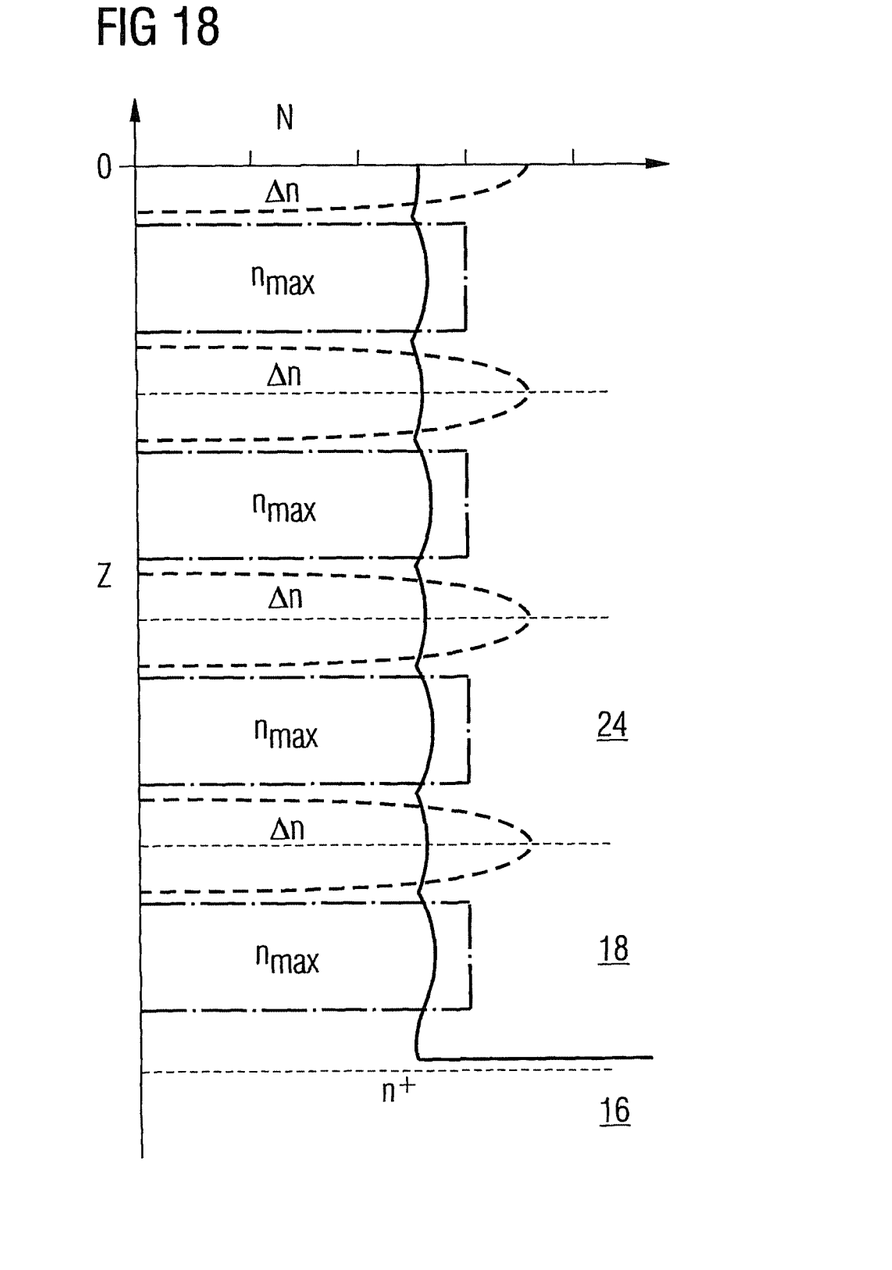
FIG. 18 is a diagram illustrating further reduced fluctuations of the charge carrier concentration in the drift zone.

FIG. 18 illustrates further reduced fluctuations of the charge carrier concentration in the drift zone. The doping material concentration N is plotted on the abscissa, while the thickness or depth in the direction z of the individual epitaxial growth phases is once again plotted on the ordinate. The dot-dash line within each epitaxial growth phase indicates a maximum concentration of doping material introduced into each epitaxial layer, while ion implantation with a concentration of $\Delta n$ is carried out between the epitaxial growth phases, which in turn prevents the lateral outdiffusion of the complementary-conducting material for the charge compensation zones.

The distribution of the charge carrier concentration $\Delta n$ introduced by ion implantation is indicated by broken lines, while the fluctuation of the charge carrier concentration in the drift zones after diffusion is indicated by a continuous line. Any fluctuations which are still noticeable are so negligible that the charge compensation zones and the drift zones can come closer together, allowing for a higher drift zone doping.

Figure 19:
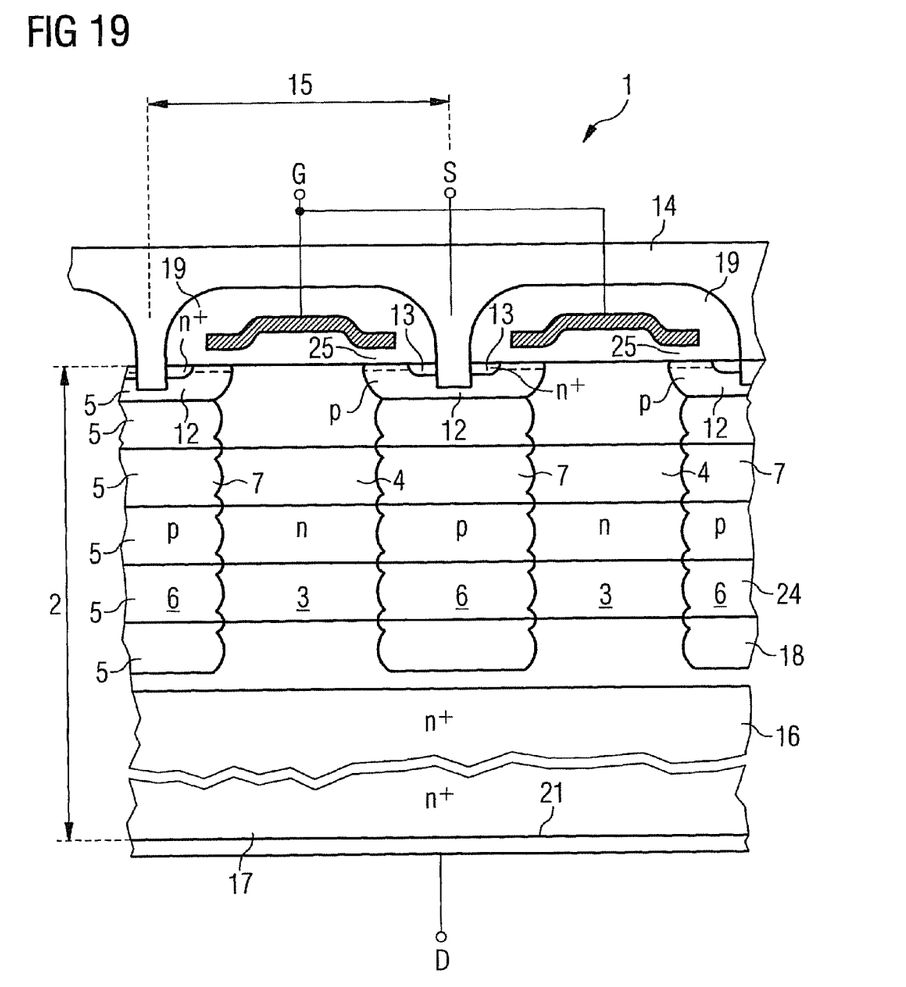
FIG. 19 illustrates a diagrammatic cross-section through a semiconductor device according to an embodiment of the invention.

FIG. 19 illustrates a diagrammatic cross-section through a semiconductor device 1 according to an embodiment wherein the lateral outdiffusion for the charge compensation zones 6 is significantly reduced by the methods described above, whereby the fluctuation of the doping material concentration in the drift zones is reduced in the vertical direction. This embodiment is a vertical MOSFET with a lateral gate structure, but the teaching of the invention can also be applied to JFET or other compensated device structures, provided that a multiple epitaxial structure is provided for the drift zone.

In this embodiment, the charge compensation zones are completed by the near-surface introduction of a p-type body zone 12, which in turn accommodates a highly doped $n^+$-type source zone 13, wherein the highly doped $n^+$-type source zone 13 and the body zone 12 are contacted by a metallic source electrode 14, while a lateral gate structure insulated against the body zone 12 by a gate oxide 25 permits the control of this power transistor. As a result of the negligible lateral bulging of the charge compensation zones, a step size 15 of less than 12 µm can be achieved between the charge compensation zones.

Before the back side 21 of the semiconductor body 2 is metallised for a drain D, the substrate 17 or the original semiconductor wafer 16 can be ground thin, thus further minimising the on resistance of the semiconductor device 1.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for the production of a semiconductor device with a semiconductor body having drift zones of a first conduction type and charge compensation zones of a complementary conduction type, the method comprising:
   a) providing a semiconductor wafer as a semiconductor substrate;
   b) applying an epitaxial layer in a first epitaxial growth phase, during which the semiconductor material is in the process of epitaxial growth doped on the semiconductor wafer with 20 to 80 atomic % of a total implanted doping material of the first conduction type;
   c) unmasked ion implantation of doping material of the first conduction type for the near-surface introduction of a doping material balance of 80 to 20 atomic % of the total dopant implanted into the epitaxial layer;
   d) masked ion implantation for a charge compensation zone structure with a doping complementary to the drift zone;
   e) repeating steps b) to d) until a predetermined epitaxial layer thickness is reached;
   f) indiffusing of the doping materials for the drift zones and the charge compensation zones until coherent charge compensation zones are generated;
   g) completing of a semiconductor chip structure for power semiconductor devices on the semiconductor wafer; and
   wherein the doping with 20 to 80 atomic % of the total dopant implanted of the doping material of the first conduction type is carried out with inhomogeneous distribution during the application of the epitaxial layer in the epitaxially grown semiconductor material in such a way that a maximum of the concentration of doping material is introduced into the semiconductor material in a middle region of an individual epitaxial growth phase.

2. The method of claim 1, wherein a doping material balance for the first conduction type, the concentration of which is higher than the concentration of the already homogeneously distributed doping material of the epitaxially grown semiconductor material, is introduced by ion implantation and diffusion.

3. The method of claim 1, wherein a doping material balance with a concentration comprising nearly two thirds of the total concentration of doping material of the drift zones is introduced near the surface by using ion implantation and diffusion.

4. The method of claim 1, wherein a doping material balance for drift zones is introduced over a large area and implanted without a mask into the epitaxially grown semiconductor material by ion implantation and diffusion.

5. The method of claim 1, wherein the charge compensation zones are introduced in column- or strip-shaped regions into the epitaxially grown semiconductor material by masked ion implantation and diffusion.

6. The method of claim 1, wherein body zones with a doping complementary to the first conduction type are introduced near the surface into the epitaxially grown semiconductor material, wherein source zones of the first conduction type with a higher doping than the drift zones are introduced into the body zones, and wherein contact holes are then produced through an insulating layer up to the source zones and the body zones, to which a conductive source electrode structure is subsequently applied.

7. The method of claim 1, wherein the introduction of the doping materials provides a doping material dose $C_D$ in the drift zones and into the charge compensation zones which is less than the breakdown charge $C_L$ with $C_D \leq C_L$ of silicon with $C_L = 2 \times 10^{12}\,\text{cm}^{-2}$.

8. The method of claim 1, wherein the charge compensation zones are arranged at a step size p in micrometers, with $p \leq 11\,\mu m$.

9. The method of claim 1, wherein, within the epitaxially grown semiconductor material, the homogeneously distributed concentration of the doping material of the drift zones never falls below zero at any time during production.

10. The method of claim 1, wherein the completion of the semiconductor chip structures for power semiconductor devices on the semiconductor wafer is followed by the thinning of the semiconductor substrate and by its cutting into semiconductor chips.

\* \* \* \* \*

UNITED STATES PATENT AND TRADEMARK OFFICE
CERTIFICATE OF CORRECTION

PATENT NO. : 8,569,150 B2
APPLICATION NO. : 13/085196
DATED : October 29, 2013
INVENTOR(S) : Willmeroth et al.

It is certified that error appears in the above-identified patent and that said Letters Patent is hereby corrected as shown below:

In the Claims

Column 8, line 18, claim 1 should read as follows:

1. A method for the production of a semiconductor device with a semiconductor body having drift zones of a first conduction type and charge compensation zones of a complementary conduction type, the method comprising:
    a) providing a semiconductor wafer as a semiconductor substrate;
    b) applying an epitaxial layer in a first epitaxial growth phase, during which the semiconductor material is in the process of epitaxial growth doped on the semiconductor wafer with 20 to 80 atomic % of a total <u>dopant</u> ~~implanted doping material~~ of the ~~first conduction type~~<u>epitaxial layer</u>;
    c) unmasked ion implantation of doping material of the first conduction type for the near-surface introduction of a doping material balance of 80 to 20 atomic % of the total dopant ~~implanted into~~ <u>of</u> the epitaxial layer;
    d) masked ion implantation for a charge compensation zone structure with a doping complementary to the drift zone;
    e) repeating steps b) to d) until a predetermined epitaxial layer thickness is reached;
    f) indiffusing of the doping materials for the drift zones and the charge compensation zones until coherent charge compensation zones are generated;
    g) completing of a semiconductor chip structure for power semiconductor devices on the semiconductor wafer; and Signed and Sealed this
Twenty-seventh Day of May, 2014

Michelle K. Lee
*Deputy Director of the United States Patent and Trademark Office* wherein the doping with 20 to 80 atomic % of the total dopant ~~implanted~~ of the doping material of the first conduction type is carried out with inhomogeneous distribution during the application of the epitaxial layer in the epitaxially grown semiconductor material in such a way that a maximum of the concentration of doping material is introduced into the semiconductor material in a middle region of an individual epitaxial growth phase.

UNITED STATES PATENT AND TRADEMARK OFFICE
CERTIFICATE OF CORRECTION

PATENT NO. : 8,569,150 B2
APPLICATION NO. : 13/085196
DATED : October 29, 2013
INVENTOR(S) : Willmeroth et al.

Page 1 of 2

It is certified that error appears in the above-identified patent and that said Letters Patent is hereby corrected as shown below:

In the Claims

Column 8, line 18, claim 1 should read as follows:

1. A method for the production of a semiconductor device with a semiconductor body having drift zones of a first conduction type and charge compensation zones of a complementary conduction type, the method comprising:
   a) providing a semiconductor wafer as a semiconductor substrate;
   b) applying an epitaxial layer in a first epitaxial growth phase, during which the semiconductor material is in the process of epitaxial growth doped on the semiconductor wafer with 20 to 80 atomic % of a total dopant of the epitaxial layer;
   c) unmasked ion implantation of doping material of the first conduction type for the near-surface introduction of a doping material balance of 80 to 20 atomic % of the total dopant of the epitaxial layer;
   d) masked ion implantation for a charge compensation zone structure with a doping complementary to the drift zone;
   e) repeating steps b) to d) until a predetermined epitaxial layer thickness is reached;
   f) indiffusing of the doping materials for the drift zones and the charge compensation zones until coherent charge compensation zones are generated;

This certificate supersedes the Certificate of Correction issued May 27, 2014.

Signed and Sealed this
Twenty-second Day of July, 2014

Michelle K. Lee
*Deputy Director of the United States Patent and Trademark Office* g) completing of a semiconductor chip structure for power semiconductor devices on the semiconductor wafer; and wherein the doping with 20 to 80 atomic % of the total dopant of the doping material of the first conduction type is carried out with inhomogeneous distribution during the application of the epitaxial layer in the epitaxially grown semiconductor material in such a way that a maximum of the concentration of doping material is introduced into the semiconductor material in a middle region of an individual epitaxial growth phase.